(12) United States Patent
Maruyama et al.

(10) Patent No.: US 7,682,978 B2
(45) Date of Patent: Mar. 23, 2010

(54) PLASMA PROCESSING METHOD AND HIGH-RATE PLASMA ETCHING APPARATUS

(75) Inventors: Koji Maruyama, Nirasaki (JP); Yusuke Hirayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 522 days.

(21) Appl. No.: 11/473,052

(22) Filed: Jun. 23, 2006

(65) Prior Publication Data

US 2006/0289296 A1   Dec. 28, 2006

Related U.S. Application Data

(60) Provisional application No. 60/699,405, filed on Jul. 15, 2005.

(30) Foreign Application Priority Data

Jun. 24, 2005   (JP)   ............................. 2005-184543

(51) Int. Cl.
*H01L 21/302*   (2006.01)
*H01L 21/461*   (2006.01)
(52) U.S. Cl. .................. 438/706; 438/710; 438/714

(58) Field of Classification Search .................. None
See application file for complete search history.

(56) References Cited

U.S. PATENT DOCUMENTS

| 6,784,112 | B2 * | 8/2004 | Arita et al. ................. 438/714 |
| 2004/0048487 | A1 * | 3/2004 | Saita et al. ................. 438/714 |
| 2004/0053505 | A1 * | 3/2004 | Chinn et al. ................ 438/710 |

\* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

A plasma processing method for use in a processing chamber of a plasma processing apparatus having a mounting table and a ceiling portion, there being formed a plasma processing space between the mounting table and the ceiling portion, includes the steps of mounting a target object on the mounting table, setting a gap between the ceiling portion and the mounting table to be greater than about 25 mm and less than about 65 mm, and performing a plasma processing on the target object by generating a plasma in the processing space. The target object includes an opening pattern having openings and at least parts of the openings are equal to or greater than about 500 μm.

15 Claims, 4 Drawing Sheets

PLASMA PROCESSING METHOD AND HIGH-RATE PLASMA ETCHING APPARATUS

FIELD OF THE INVENTION

The present invention relates to a plasma processing method and a high-rate plasma processing apparatus and, more specifically, to a method and apparatus for performing an etching processing or the like using plasma of a reactive gas.

BACKGROUND OF THE INVENTION

In a manufacturing process of MEMS (Micro Electro Mechanical System) devices, a plasma etching processing is performed in order to form holes or grooves on a target object such as a silicon substrate. In a MEMS processing, the diameters of holes or the widths of grooves that are formed by the plasma etching may be greater than 100 µm, and thus the sizes of the openings of a mask pattern become large accordingly. Therefore, the area ratio of the openings (opening ratio) that take up the area of the target object is increased.

In order to perform a plasma etching on the target object which has an opening pattern with large openings and large opening ratio, performing a high-rate etching is required in comparison with an etching that is performed in semiconductor manufacturing processes. With respect to a high-rate etching to silicon, there is suggested a method for realizing a high-rate silicon etching on the target object that has the opening pattern whose the sizes of the openings are from 5 µm to 200 µm by controlling the distance between a plasma generating portion and the target object, preferably, equal to or less than 20 µm, and setting a gas pressure in a processing chamber to be in the range from 13 Pa to 1,333 Pa (for example, see Japanese Patent Laid-open Publication NO. 2002-93776, claims 1 and 3 etc.).

In general, the etching rate is desirable to be high in order to enhance the throughput. Especially, since etching the target object which has an opening pattern with large openings and large opening ratio is performed in the MEMS processing, the above-described high-rate etching is needed.

However, when the high-rate etching is performed on the target object which has the opening pattern with the large openings whose size gets large to be equal to or greater than 500 µm, etching nonuniformity occurs on the surface of the target object. Specifically, when a central portion is compared with a peripheral portion on the surface of the target object, the etching rate at the peripheral portion is higher than that at the central portion. As a result, an etching amount at the peripheral portion is greater than that at the central portion. Therefore, there is a problem that the depths of the holes or grooves are not uniform on the surface of target object.

SUMMARY OF THE INVENTION

It is, therefore, an object of the present invention to provide a plasma processing method that does not create processing nonuniformity and is capable of a uniform processing even when the plasma etching is performed on a target object which is patterned with a large opening size and at a large opening ratio.

In accordance with an aspect of the present invention, there is provided a plasma processing method for use in a processing chamber of a plasma processing apparatus having a mounting table and a ceiling portion, there being formed a plasma processing space between the mounting table and the ceiling portion, the method including the steps of: mounting a target object on the mounting table, the target object including a opening pattern having openings, opening sizes of at least parts of the openings being equal to or greater than about 500 µm; setting a gap between the ceiling portion and the mounting table to be greater than about 25 mm and less than 65 mm; and performing a plasma processing on the target object by generating a plasma in the processing space.

Preferably, in the above-described plasma processing method, an opening ratio of the openings of the target object is greater than about 2%.

Preferably, in the above-described plasma processing method, the gap is to be equal to or greater than about 40 mm and equal to or less than about 55 mm.

Preferably, in the above-described plasma processing method, a high frequency power for generating the plasma is applied to the mounting table and the opening sizes are equal to or greater than about 1500 µm.

Preferably, in the above-described plasma processing method, an opening ratio of the openings of the target object is equal to or greater than about 25%.

Preferably, in the above-described plasma processing method, the plasma processing is a silicon etching processing.

Preferably, in the above-described plasma processing method, the plasma processing is performed at an etching rate equal to or greater than about 5 µm/min.

Preferably, in the above-described plasma processing method, a mixture gas of $SF_6$ and $O_2$ is used as an etching gas.

Preferably, in the above-described plasma processing method, the plasma processing is performed under a pressure in the range from about 6.7 Pa to 133.3 Pa.

Preferably, in the above-described plasma processing method, the plasma processing apparatus is of a parallel-plate type.

In accordance with another aspect of the present invention, there is provided a computer executable control program for performing the above-described plasma processing method by controlling the processing chamber.

In accordance with still another aspect of the present invention, there is provided a computer readable storage medium containing a computer executable control program, wherein the program performs the above-described plasma processing method by controlling the process chamber.

In accordance with still another aspect of the present invention, there is provided a plasma processing apparatus including: a mounting table for mounting thereon a target object; a processing chamber containing the mounting table and being capable of being kept in vacuum; and a control unit for controlling the processing chamber to perform the above-described plasma processing method.

In accordance with still another aspect of the present invention, there is provided a plasma etching apparatus, including: a mounting table for mounting an object; a ceiling portion, there formed a plasma processing space between the mounting table and the ceiling portion; a processing chamber containing the mounting table and performing a plasma etching processing therein, the chamber being capable of being kept in vacuum; and a control unit, wherein the control unit controls a gap between the mounting table and the ceiling portion to be greater than about 25 mm and less than about 65 mm to perform the plasma etching processing on a target object at an etching rate equal to or greater than about 5 µm/min, and the target object has a opening pattern having openings, opening sizes of at least parts of the openings being equal to or greater than about 500 µm.

Preferably, in the above-described plasma etching apparatus, the opening sizes are equal to or greater than about 1500

µm and the gap is equal to or greater than about 40 mm and equal to or less than about 55 mm.

In accordance with the present invention, even when a plasma processing of etching or the like is performed to the target object which has a mask pattern with large openings and a large opening ratio, the nonuniformity does not occur and the uniform processing is possible by setting a gap between the mounting table that defines the plasma processing space in the processing chamber of the plasma processing apparatus and the ceiling portion greater than 25 mm and less than 65 mm.

Particularly, when the plasma processing is the etching processing, the etching shape can be controlled and the processing nonuniformity does not occur by setting the gap greater than about 25 mm and less than 65 mm. In addition, the etching rate can be enhanced in comparison with a case in which the gap is small.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
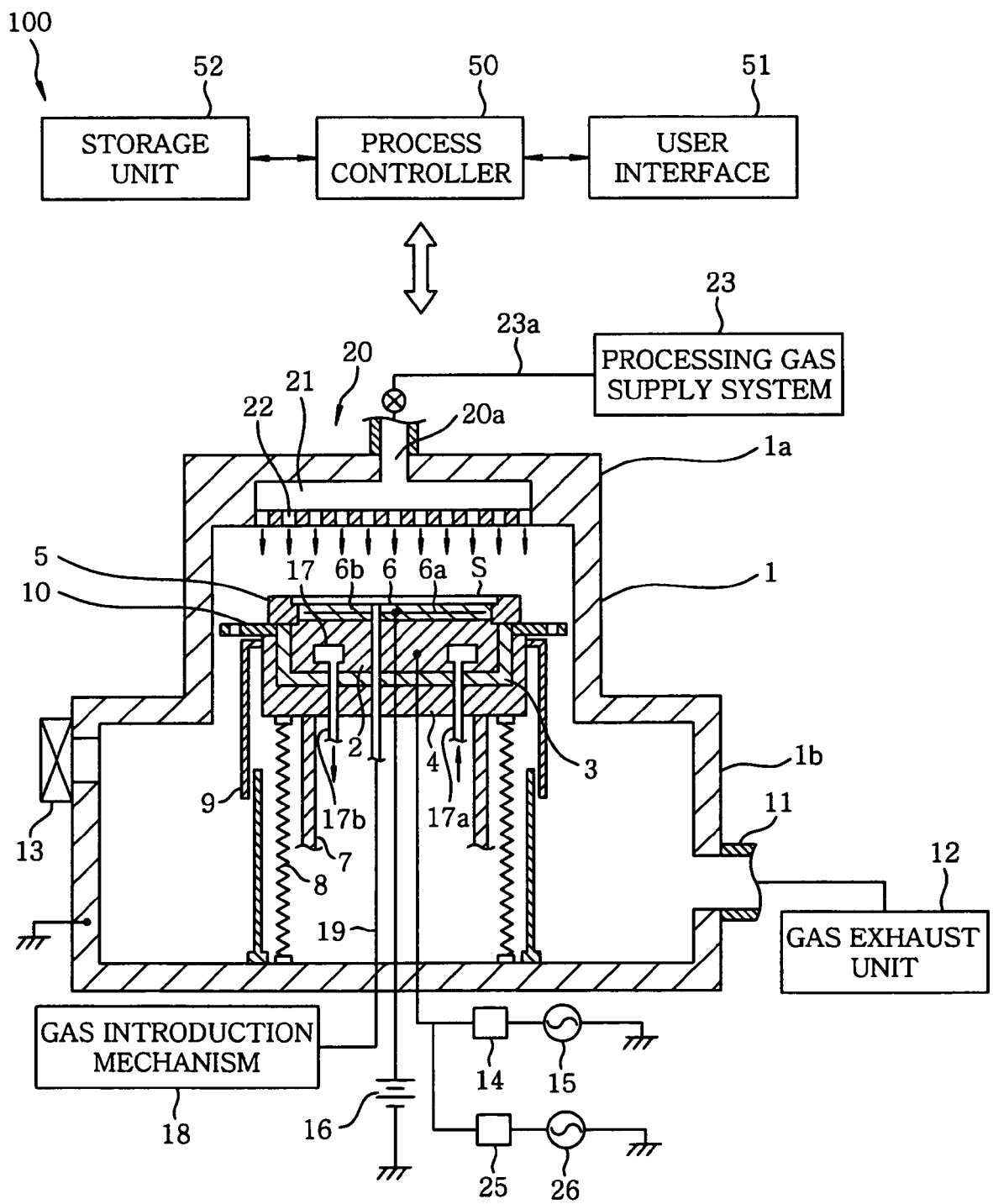
FIG. 1 is a cross sectional view of a schematic configuration of a plasma etching apparatus for performing plasma etching method in accordance with a preferred embodiment of the present invention.

Hereinafter, a preferred embodiment of the present invention will be described with reference to the drawings. FIG. 1 is a cross sectional view of a schematic configuration of an RIE type plasma etching apparatus 100 that can be used appropriately for the purpose of performing a method of the present invention. The etching apparatus 100 has an airtight configuration, and includes a stepped cylindrical chamber (processing vessel) 1 whose wall portion is made of, e.g., aluminum. The chamber 1 has an upper portion 1a with a small diameter and a lower portion 1b with a diameter larger than that of the upper portion 1a.

In the chamber 1, a supporting table 2 is formed as a mounting table 2 that holds horizontally, e.g., a silicon substrate for MEMS process (hereinafter, referred to as "substrate S") as a target object. The supporting table 2 is made of, e.g., aluminum and is supported by a support unit 4 made of a conductor through an insulating plate 3. In addition, a focus ring 5 made of, e.g., silicon, quartz or the like is formed on an upper periphery of the supporting table 2. The supporting table 2 and the support unit 4 can be vertically moved upward and downward by a ball screw mechanism including ball screws 7, and a driving portion below the support unit 4 is covered with a bellows 8 made of stainless steel (SUS). A bellows cover 9 is formed outside the bellows 8. A baffle plate 10 is provided outside the focus ring 5. Also, the chamber 1 is grounded.

A gas exhaust port 11 is formed on a side wall of the lower portion 1b of the chamber 1, and the gas exhaust port 11 is connected to a gas exhaust unit 12. A vacuum pump of the gas exhaust unit 12 is capable of reducing pressure in the process chamber 1 to a predetermined vacuum degree. In addition, a gate valve 13 for opening/closing a loading/unloading gate of the substrate S is formed on the upper side wall of the lower portion 1b of the chamber 1.

A first high frequency power supply 15 for generating plasma is connected to the supporting table 2 through a matching unit 14, and high frequency power of a predetermined frequency is supplied from the first high frequency power supply 15 to the supporting table 2. In addition, a shower head 20 is provided above the supporting table 2 to face and be parallel to the supporting table 2, and the shower head 20 is grounded. Therefore, the supporting table 2 and the shower head 20 function as a pair of electrodes.

A feeder line of the first high frequency power supply 15 is connected to a second high frequency power supply 26 through a matching unit 25. The second high frequency power supply 26 supplies high frequency power whose frequency is lower than that of the first high frequency power supply 15 to be superimposed on the high frequency power for generating plasma.

An electrostatic chuck 6 for electrostatically chucking and holding the substrate S is formed on the surface of the supporting table 2. The electrostatic chuck 6 is formed by interposing an electrode 6a in an insulator 6b, and the electrode 6a is connected to a DC power supply 16. Also, when a voltage is applied from the DC power supply 16 to the electrode 6a, an electrostatic force, e.g., a Coulomb force, is generated to attract and hold the substrate S.

The supporting table 2 has a temperature control medium container 17 therein. In the temperature control medium container 17, a temperature control medium is introduced through an inlet line 17a and the medium is discharged from a discharge line 17b to be circulated. Therefore, heat (warming heat or cooling heat) is transferred to the substrate S through the supporting table 2 to maintain the process surface of the substrate S at a desired temperature.

Furthermore, in order for the substrate S to be effectively temperature-controlled by the temperature control medium circulated by the temperature control medium container 17 even when the chamber 1 is exhausted to a vacuum state by the gas exhaust unit 12, a gas as a heat transfer medium is introduced between a surface of the electrostatic chuck 6 and a rear surface of the substrate S at a predetermined pressure (back pressure) through the gas supply line 19 by a gas introduction mechanism 18. By introducing the gas as the heat transfer medium as described above, the heat of the temperature control medium is transferred effectively to the substrate S to enhance the efficiency of temperature control.

The shower head 20, which is a ceiling portion of the chamber 1, is placed to face the supporting table 2. A large number of gas discharge holes 22 are formed on a lower surface of the shower head 20 and, in addition, a gas inlet unit 20a is formed on an upper portion thereof. Also, a space 21 is formed at the shower head 20. The gas inlet unit 20a is connected to a gas supply line 23a and the other end of the gas supply line 23a is connected to a processing gas supply system 23 that supplies a processing gas such as an etching gas and the like.

The processing gas flows from the processing gas supply system 23 via the gas supply line 23a and the gas inlet unit 20a to reach the space 21 in the shower head 20. Then the gas is discharged from the gas discharge holes 22.

Figure 2:
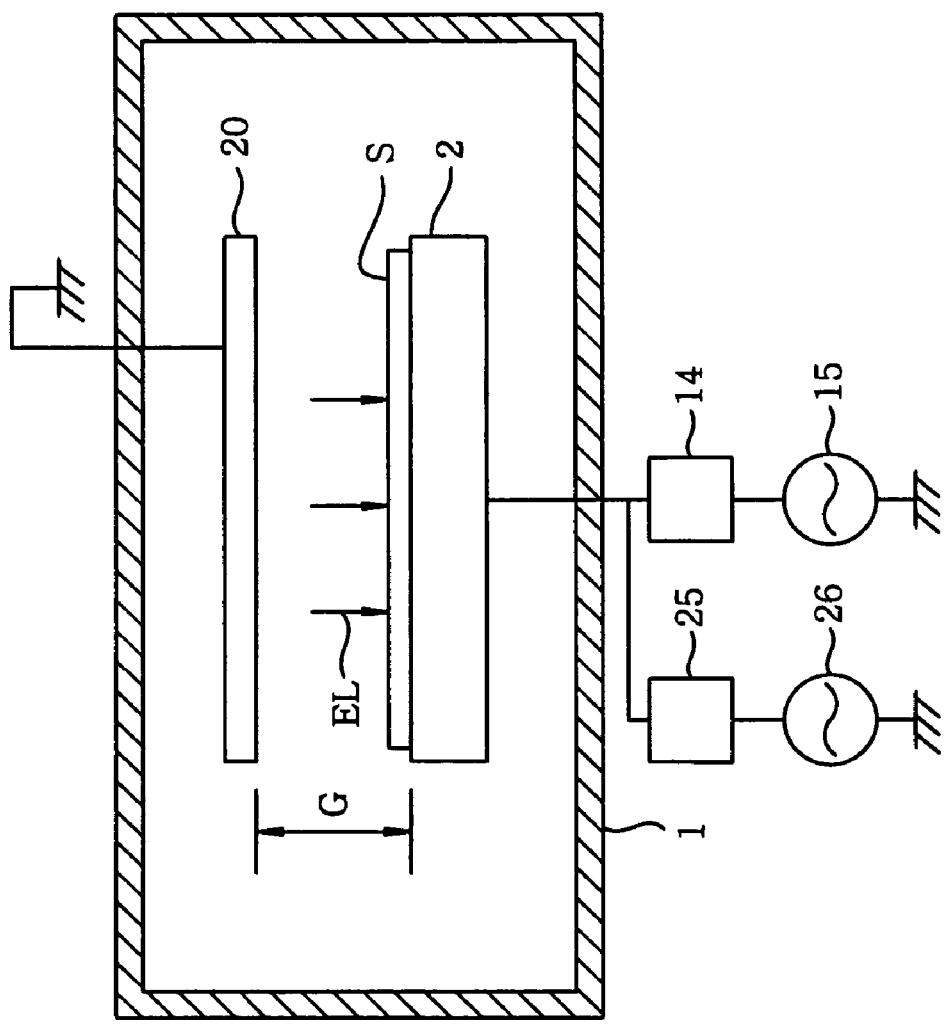
FIG. 2 offers a view for explaining an electric field and a gap formed in a chamber.

Therefore, as schematically shown in FIG. 2, an electric field EL in a vertical direction is generated in the space between the supporting table 2 and the shower head 20 by the first high frequency power supply 15. Therefore, plasma of the etching gas in a high-energy state is generated to etch the substrate S. In addition, symbol G of FIG. 2 indicates a gap from the upper surface of the supporting table 2 to the lower surface of the shower head 20 as the ceiling portion, i.e., the gap between the upper electrode and the lower electrode.

Furthermore, each configuration unit of the plasma etching apparatus 100 is connected to, and is controlled by a process controller 50 including a CPU. The process controller 50 is connected to a keyboard with which a process administrator executes command input manipulation etc. to manage the plasma etching apparatus 100, and a user interface 51 consisting of a display or the like that visualizes and displays an operation status of the plasma etching apparatus 100.

Furthermore, a storage unit 52 is connected to the process controller 50. The storage unit 52 stores the recipes that record control programs or data for processing conditions so that various processes performed in the plasma etching apparatus 100 are realized by controlling the process controller 50.

Furthermore, as occasion demands, when a command is received from the user interface 51, the recipe in accordance with the command is read out from the storage unit 52 and executed by the process controller 50, so that a desirable processing in the plasma etching apparatus 100 is performed under the control of the process controller 50. In addition, the recipe can be stored in a readable storage medium, e.g., a CD-ROM, a hard disc, a flexible disc, a flash storage or the like. On the other hand, the recipes can be transmitted from other devices, e.g., via a dedicated line on occasion.

Figure 3A:
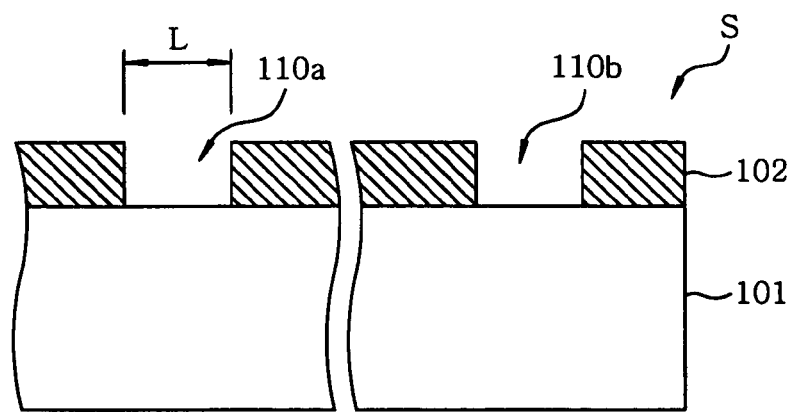
FIGS. 3A to 3C describe cross sectional views of a substrate for explaining a plasma etching processing procedures.
Figure 3B:
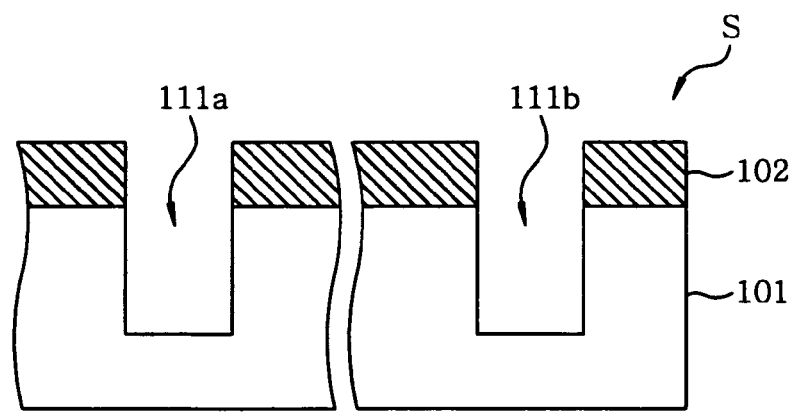
Figure 3C:
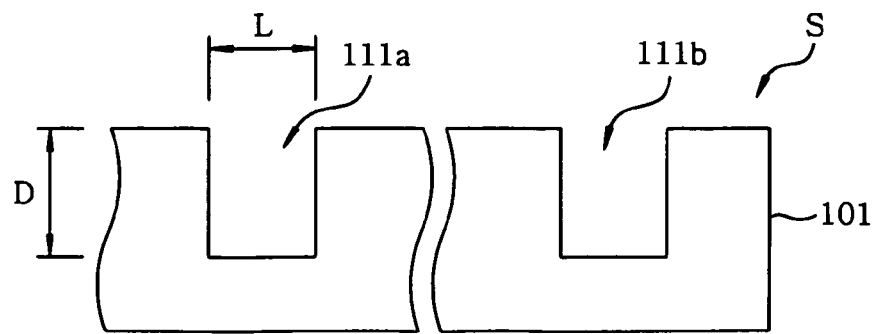

Hereinafter, a plasma etching method in accordance with a first preferred embodiment of the present invention using the plasma etching apparatus 100 will be described with reference to FIGS. 3A to 3C. First, the gate valve 13 of FIG. 1 is opened to load the substrate S in the chamber 1 and the substrate S is mounted on the supporting table 2. Thereafter, the supporting table 2 is moved upward to the position shown in FIG. 1 to set the gap G (see FIG. 2) between the upper electrode and the lower electrode. The gap G is preferably greater than 25 mm and less than 65 mm, and more preferably equal to or greater than 40 mm to equal to or less than 65 mm. The reason is as follows: If the gap G is equal to or less than 25 mm, the plasma that is generated in the space above the substrate S does not reach sufficient density and the supply of the etchant to the substrate S is insufficient. Therefore, the supply of the etchant from the horizontal direction is greater than that from the vertical direction, and thus the etching rate at a peripheral portion of the substrate S is higher than that at a central portion, resulting in nonuniformity on the surface of the substrate S, i.e., etching nonuniformity. In addition, if the gap G is equal to or greater than 65 mm, the control of an etching shape may be difficult.

Thereafter, the interior of the chamber 1 is evacuated by the vacuum pump of the gas exhaust unit 12 through the gas exhaust port 11. As shown in FIG. 3A, the substrate S has a configuration in which a mask layer 102 having a predetermined opening pattern is stacked on a silicon layer 101 as an etching layer to be processed. There is no particular limit to the layer 102 and, a photoresist or a hard mask layer such as an oxide film can be used as the mask layer 102.

An opening 110a is formed on the central portion of the mask layer 102 of the substrate S, and an opening 110b is formed on the peripheral portion thereof. Herein, each of the size of the openings 110a and 110b is large corresponding to the large-sized recesses (holes or grooves etc.) formed on the silicon layer 101. The size can be a diameter, width or the like according to the shape of the openings, i.e., a circle, a groove or the like respectively. In addition, size L (diameter or width) is, for instance, equal to or greater than 500 μm. The effect of the present invention is prominent especially when the size L is equal to or greater than 1500 μm.

Although the size L of the openings 110a and 10b is, for instance, appropriately 2000 μm, there is no upper limit thereto. In addition, an opening ratio of the openings 110a and 110b, i.e., a relative percentage of an area of the openings 110a and 10b to an area of the substrate S is equal to or greater than 2%. The effect of the present invention is prominent especially when the opening ratio is equal to or greater than 5%. Although there is no upper limit thereto, the opening ratio is, for instance, appropriately 25%.

Thereafter, an etching gas is introduced from the processing gas supply system 23 into the chamber 1 at a predetermined flow rate. Then, a gas pressure in the chamber 1 is set to be in the range from, for instance, 6.7 Pa to 133.3 Pa (50 mTorr to 1 Torr) and the temperature of the substrate S (supporting table 2) is set to be in the range from −50° C. to 30° C. Under the above-described condition, predetermined high frequency power is supplied from each of the first high frequency power supply 15 and the second high frequency power supply 26 to the supporting table 2. At this time, the substrate S is attracted to and held by the electrostatic chuck 6 through, for instance, the Coulomb force by applying a predetermined voltage from the DC power supply 16 to the electrode 6a of the electrostatic chuck 6.

Furthermore, a gas as the heat transfer medium for effectively supplying heat (warming heat or cooling heat) to the substrate S is introduced between the surface of the electrostatic chuck 6 and the rear surface of the substrate S at a predetermined pressure (back pressure). For example, a He gas or the like can be used for the gas.

During the etching processing, frequency and power of the first high frequency power supply 15 is appropriately set to generate desirable plasma. In order to enhance plasma density directly above the substrate S, it is desirable to set the frequency equal to or greater than, for instance, 40 MHz, e.g., 100 MHz.

Furthermore, the second high frequency power supply 26 supplies high frequency power to control ion energy, and the frequency is preferably lower than that of the first high frequency power supply 15, for instance, 13.56 MHz.

In order to enhance the etching rate, if a diameter of the substrate S is 150 mm, the high frequency power from the first high frequency power supply 15 is preferably set to be in the range from 200 W to 1500 W. In addition, the high frequency power from the second high frequency power supply 26 is preferably set to be in the range from 0 W to 500 W.

Thus, a high frequency electric field is formed between the shower head 20 as the upper electrode and the supporting table 2 as the lower electrode. Therefore, the plasma of the etching gas is generated by the high frequency electric field, and the silicon layer 101 of the substrate S is etched by the plasma, thereby forming the recesses 111a and 111b of the holes or grooves or the like as shown in FIG. 3B.

In this case, not only ions and charged particles of electrons but also a sufficient amount of radicals can be generated by setting gas pressure in the chamber 1 to be in the above-described range. The radicals act effectively to enhance the etching rate. Thereafter, by performing an ashing processing on a mask layer 102 to remove the mask layer 102, the substrate S on which recesses 111a and 111b are formed to have the size that approximately corresponds to the size L of openings 110a and 110b of the mask layer 102 can be obtained as shown in FIG. 3C.

In the preferred embodiment, since high frequency power is applied to the supporting table 2 that mounts the substrate S as the lower electrode by using an RIE type plasma generating mechanism, plasma can be formed directly above the target object. Accordingly, the substrate S can be etched at a higher rate.

It is desirable to use a gas that includes a high reactive fluorine-containing compound gas as an etching gas used for etching process in order to etch the substrate S at a high rate. It is desirable to use, for instance, a gas mixture of $SF_6$ and $O_2$ as the gas that includes a high reactive fluorine-containing compound gas. Also, in that the gas mixture of $SF_6$ and $O_2$ as the etching gas is used in order to enhance the selectivity or increase controllability of an etching shape, a halogen gas $SiF_4$, $NF_3$, HBR, $Cl_2$ or the like may be used. Also, a rare gas such as Ar, He or the like may be used together with the etching gas.

As described above, a desired etching process is performed on the substrate S by using the plasma etching apparatus 100. With the etching method of the present invention, a high-rate etching is possible at a high etching rate, for example, equal to or greater than 5 μm/min, preferably, equal to or greater than 10 μm/min. Also, when the high-rate etching is performed, uniformity on the surface of the substrate S is guaranteed by controlling the gap G in the specified range. In other words, a depth D of the recess 111a that is formed on the central portion of the substrate S is approximately identical to the depth D of the recess 111b that is formed on the peripheral portion thereof.

Figure 4A:
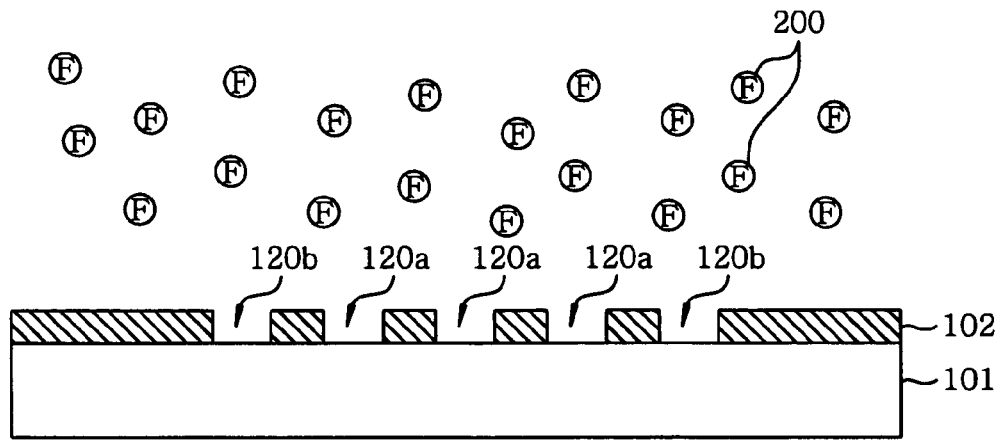
FIGS. 4A to 4C illustrate a view for explaining a mechanism of etching nonuniformity due to supply limitation of etchant.
Figure 4B:
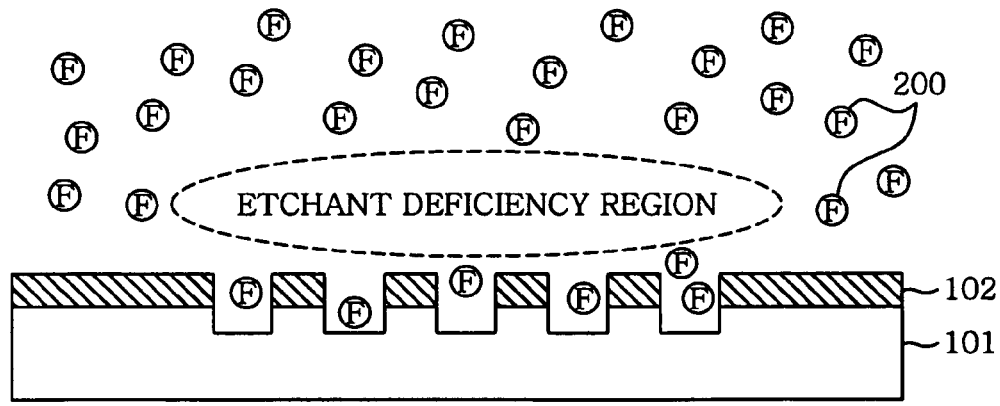
Figure 4C:
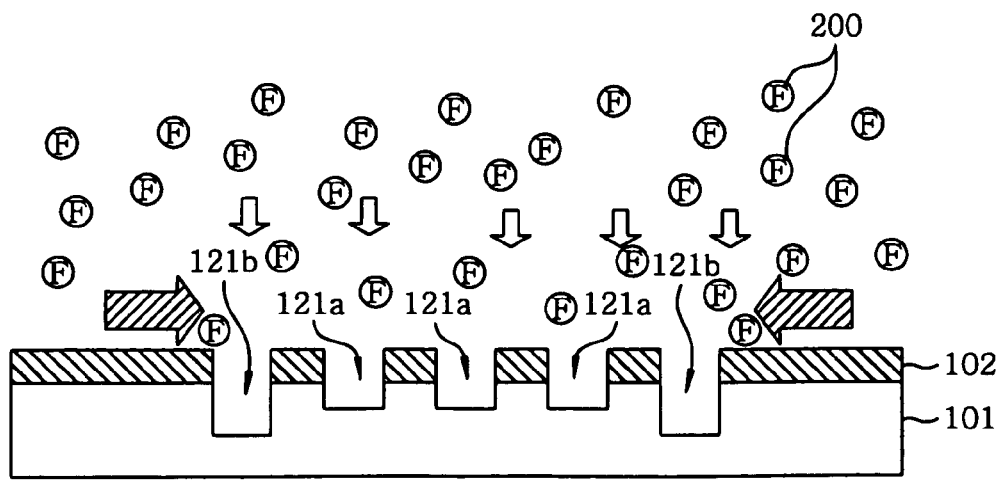

Herein, the operation mechanism of the present invention will be explained referring to FIGS. 4A to 4C. In a high-rate etching that uses a mask pattern with a large opening ratio and large openings, the mechanism of generating nonuniformity of etching amount across the surface is related to the loading effect of etchant. FIGS. 4A to 4C schematically show cross sectional views of the substrate S during the etching process. First, FIG. 4A describes a state that etchant 200 such as F radials or the like among the plasma is generated above the Si layer 101 that has a patterned mask layer 102. The generated etchant 200 reacts with Si that is exposed in the openings 120a and 120b of the mask layer 102. Also, the openings 120a represent openings at the central portion of the Si layer 101, and the openings 120b are openings at the peripheral portion thereof.

Since the etching is progressed by consuming the etchant 200 through a reaction between the etchant 200 and Si, the etchant 200 above the openings 120a and 120b gets deficient and generates etchant deficiency region during the etching process as shown in FIG. 4B.

The etchant 200 moves in a horizontal direction from a circumferential region having high density of the etchant (a region where the consumption of the etchant is not progressed since Si is not exposed) to the etchant deficiency region in order to supplement the etchant 200. The movement of the etchant 200 that is supplemented is described as hatched arrows in FIG. 4C.

Thus, the etching process is progressed by repetition of a phenomenon shown in FIGS. 4A to 4C during a very short period. However, if the supplement of the etchant from the horizontal direction as shown in FIG. 4C gets larger than the supply from the vertical direction (shown as white arrows in FIG. 4C), the etchant around the openings 120b at the peripheral portion of the Si layer 101 gets larger than that of the openings 120a at the central portion. Therefore, the etching rate at the peripheral portion is increased compared with the etching rate at the central portion.

The phenomenon is caused by the breakdown of a balance between the supply of the etchant 200 from the vertical direction and the supplement of the etchant 200 from the horizontal direction, which is caused by the generation of by-product due to the consumption and reaction of the etchant. If the sizes of the openings on the opening pattern are from several μms to several tens of μms, the etchant deficiency region is hard to occur since uniformity of the plasma is dominant. However, if the etching is performed to the target object that is patterned with the sizes of the openings equal to or greater than 500 μm and at large opening ratio equal to or greater than 2%, the etchant deficiency region is easy to occur, and the balance of the supply and the supplement of the etchant 200 is also easy to be broken.

In such a case, the depths of the recesses 121b, such as holes, grooves or the like, formed at the peripheral portion of the Si layer 101 of the substrate S becomes deeper than the depths of the recesses 121a formed at the central portion as shown in FIG. 4C, resulting in etching nonuniformity on the surface of the substrate S.

The gap G is related to the balance of the supply and the supplement of the etchant 200. Therefore, since a plasma-generating space gets narrow when the gap G gets small, the balance of the supply and the supplement of the etchant 200 is easy to be broken. Therefore, in the present invention, the problem of the etching nonuniformity is solved by setting the gap G wider than the conventional value in performing the etching. In other words, the nonuniformity on the surface of the substrate S due to supply limitation of the etchant is resolved by setting the gap G greater than 25 mm, preferably, equal to or greater than 45 mm. The plasma generating space gets expanded by setting the gap G wide, thereby maintaining the balance of the supply and the supplement of the etchant 200 in good order. Also, since the exhaustion efficiency of the by-product is increased by expanding the plasma generating space, the etching rate can be improved.

Hereinafter, an experimental result will be explained that confirms the effect of the present invention. The plasma etching of the Si layer 101 was performed to the silicon substrate S for MEMS process that has an identical cross sectional configuration to the substrate shown in FIGS. 3A to 3C by the plasma etching apparatus having an identical configuration to that of FIG. 1. The etching was performed by using $SF_6/O_2$ as the etching gas under conditions that will be shown below. As for samples, herein, the etching was performed to sample A with an opening ratio of 2% that is patterned with ring-shaped holes whose diameters are 500 μm, sample B with an opening ratio of 7% that is patterned with ring-shaped holes whose diameters are 500 μm and sample C with an opening ratio of 25% that is patterned with rectangular-shaped holes whose side lengths are 1500 μm.

The pressure in the chamber 1=26.7 Pa (200 mTorr);

The high frequency power of the first high frequency power supply 15 (100 MHz)=1000 W;

The high frequency power of the second high frequency power supply 26 (13.56 MHz)=100 W;

The flow rate ratio of $SF_6/O_2$=300/75 mL/min (sccm);

The gap between the upper electrode and the lower electrode=25 mm, 40 mm, 55 mm or 65 mm;

The temperature of the supporting table 2=20° C. and

The processing time=900 seconds

The etching rate of each gap G in the plasma etching processing, and the uniformity of the etching amount at the edge portion (peripheral portion) and at the center portion (the central portion) were examined. The results are represented in Table 1. In addition, the uniformity is obtained by Eq. 1 below. If the uniformity is equal to or less than 5%, it is sufficient for a practical use.

$$\text{uniformity}(\%) = \pm \frac{(\text{Max}ED - \text{Min}ED) \times 100}{2 \times \text{Avr}ED} \quad \text{Eq. 1}$$

wherein MaxED is the maximum etching depth, MinED is the minimum etching depth and AvrED is the average etching depth.

TABLE 1

|  |  | Sample A Opening ratio 2% | Sample B Opening ratio 7% | Sample C Opening ratio 25% |
|---|---|---|---|---|
| Gap 25 mm | Etching rate (μm/min) | 14.5 | — | 4.9 |
|  | Uniformity (%) | 5.2 | — | 33.3 |
| Gap 40 mm | Etching rate (μm/min) | 21.7 | 13.1 | 8.7 |
|  | Uniformity (%) | 0.7 | 4.0 | 13.0 |
| Gap 55 mm | Etching rate (μm/min) | — | 15.2 | 10.6 |
|  | Uniformity (%) | — | 4.1 | 10.9 |
| Gap 65 mm | Etching rate (μm/min) | — | 16.1 | 11.2 |
|  | Uniformity (%) | — | 2.4 | 9.7 |

In Table 1, in case of setting the gap G to be 25 mm to perform the etching, the uniformity was degraded in comparison with a case of setting the gap G equal to or greater than 40 mm in samples A and C together, and especially, the trend was dominant in the sample C with a large opening ratio. However, the uniformity was improved in comparison with setting the gap G to be 25 mm by setting the gap G to be in the range from 40 mm to 55 mm. Also, since the reaction between the etchant and Si was promoted, removal of the by-product was efficiently performed to elevate the etching rate.

Furthermore, although the uniformity was slightly improved in case of setting the gap G to be 65 mm to perform the etching, the etching shape was reverse tapered-shape in the sample C of the large opening size and the large opening ratio (the result not shown). From the results, when the gap G is set too wide, it is thought that the etching shape is hard to be controlled. Hereto, it is preferable to set the gap G greater than 25 mm and less than 65 mm and, especially, it is desirable to set the gap G to be in the range from 40 mm to 55 mm.

Hereto, although the preferred embodiment of the present invention has been described, the various changes and modifications may be made without being limited to the preferred embodiment of the present invention. For example, although a parallel-plate typed apparatus is used as the plasma etching apparatus 100 in the above-described preferred embodiment herein, other typed apparatuses can be used if the plasma can be generated in the gap G of the range of the present invention.

Furthermore, in the above-described preferred embodiment, a case that an etching is performed on the substrate S for MEMS process as the target object has been given as an example. However, the substrate S is not limited thereto and the above-described preferred embodiment can be applied to, e.g., a silicon substrate of semiconductor wafer or the like so long as the opening of the substrate S has a large diameter and the substrate S has a large opening ratio.

While the invention has been shown and described with respect to the preferred embodiments, it will be understood by those skilled in the art that various changes and modifications may be made without departing from the scope of the invention as defined in the following claims.

What is claimed is:

1. A plasma processing method for use in a processing chamber of a plasma processing apparatus having a mounting table and a shower head, there being formed a plasma processing space between the mounting table and the shower head, the method comprising the steps of:
   mounting a target object on the mounting table, the target object including an opening pattern having openings, opening sizes of at least parts of the openings being equal to or greater than about 500 μm;
   setting a gap between the shower head and the mounting table to be greater than about 25 mm and less than about 65 mm; and
   performing a plasma processing on the target object by generating a plasma in the processing space,
   wherein the plasma processing is a silicon etching processing, and
   wherein the plasma processing is performed at an etching rate equal to or greater than about 5 μm/min such that the etching rate at a peripheral portion of the target object is substantially uniform with the etching rate at a central portion.

2. The plasma processing method of claim 1, wherein an opening ratio of the openings of the target object is equal to or greater than about 2%.

3. The plasma processing method of claim 1, wherein the gap is to be equal to or greater than about 40 mm and equal to or less than about 55 mm.

4. The plasma processing method of claim 3, wherein a high frequency power for generating the plasma is applied to the mounting table and the opening sizes are equal to or greater than about 1500 μm.

5. The plasma processing method of claim 3, wherein an opening ratio of the openings of the target object is equal to or greater than about 25%.

6. The plasma processing method of claim 1, wherein a mixture gas of $SF_6$ and $O_2$ is used as an etching gas.

7. The plasma processing method of claim 6, the plasma processing is performed under a pressure in the range from about 6.7 Pa to 133.3 Pa.

8. The plasma processing method of claim 1, wherein the plasma processing apparatus is of a parallel-plate type.

9. A plasma processing method for use in a processing chamber of a plasma processing apparatus having a mounting table and a shower head, there being formed a plasma processing space between the mounting table and the shower head, the method comprising the steps of:
   mounting a target object on the mounting table, the target object including an opening pattern having openings, opening sizes of at least parts of the openings being equal to or greater than about 500 μm;
   setting a gap between the shower head and the mounting table to be greater than about 25 mm and less than about 65 mm; and
   performing a plasma processing on the target object by generating a plasma in the processing space,
   wherein the plasma processing is performed at an etching rate equal to or greater than about 5 μm/min such that the etching rate at a peripheral portion of the target object is substantially uniform with the etching rate at a central portion.

10. The plasma processing method of claim 9, wherein an opening ratio of the openings of the target object is equal to or greater than about 2%.

11. The plasma processing method of claim 9, wherein the gap is to be equal to or greater than about 40 mm and equal to or less than about 55 mm.

12. The plasma processing method of claim 11, wherein a high frequency power for generating the plasma is applied to the mounting table and the opening sizes are equal to or greater than about 1500 μm.

13. The plasma processing method of claim 11, wherein an opening ratio of the openings of the target object is equal to or greater than about 25%.

14. The plasma processing method of claim 9, wherein a mixture gas of SF6 and O2 is used as an etching gas.

15. The plasma processing method of claim 14, the plasma processing is performed under a pressure in the range from about 6.7 Pa to 133.3 Pa.

* * * * *